(12) United States Patent
Partanen

(10) Patent No.: US 11,987,492 B2
(45) Date of Patent: May 21, 2024

(54) EARLY-IMPACT MOTION LIMITER FOR MEMS DEVICE

(71) Applicant: MURATA MANUFACTURING CO., LTD., Nagaokakyo (JP)

(72) Inventor: Mikko Partanen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 388 days.

(21) Appl. No.: 17/542,740

(22) Filed: Dec. 6, 2021

(65) Prior Publication Data

US 2022/0194781 A1 Jun. 23, 2022

(30) Foreign Application Priority Data

Dec. 22, 2020 (FI) ..................................... 20206355

(51) Int. Cl.
*B81B 3/00* (2006.01)

(52) U.S. Cl.
CPC .... *B81B 3/0051* (2013.01); *B81B 2201/0235* (2013.01); *B81B 2201/0242* (2013.01)

(58) Field of Classification Search
None
See application file for complete search history.

(56) References Cited

U.S. PATENT DOCUMENTS

| 2013/0299923 A1 | 11/2013 | Classen et al. |
| 2018/0180419 A1* | 6/2018 | Geisberger ......... G01C 19/5747 |
| 2019/0120872 A1 | 4/2019 | Geisberger |

FOREIGN PATENT DOCUMENTS

| DE | 102013208684 A1 | 11/2014 |
| EP | 3306268 A1 | 4/2018 |
| JP | 2019078608 A | 5/2019 |

OTHER PUBLICATIONS

Office Action dated Nov. 25, 2022, corresponding to Japanese Patent Application No. 2021-190603.
European Search Report dated May 6, 2022 corresponding to European Patent Application No. 21211189.
Finnish Search Report dated Sep. 22, 2021 corresponding to Finnish Patent Application No. 20206355.

* cited by examiner

*Primary Examiner* — Asok K Sarkar
(74) *Attorney, Agent, or Firm* — SQUIRE PATTON BOGGS (US) LLP

(57) ABSTRACT

This disclosure describes a micromechanical device comprising a first device part and a second device part. One of the first and second device parts is a mobile rotor and the other of the first and second device parts is a fixed stator. The micromechanical device further comprises a motion limiter which extends from the first device part to the second device part. The motion limiter comprises an elongated lever, and the motion limiter is configured to bring a stopper into contact with a counter-structure by rotating the elongated lever.

8 Claims, 6 Drawing Sheets

EARLY-IMPACT MOTION LIMITER FOR MEMS DEVICE

FIELD OF THE DISCLOSURE

This disclosure relates to microelectromechanical (MEMS) devices, and particularly to motion limiters which prevent undesired contact between mobile and stationary device parts.

BACKGROUND OF THE DISCLOSURE

Microelectromechanical devices such as accelerometers and gyroscopes often comprise a mass element which is suspended from fixed anchors with a flexible suspension structure which allows the mass element to move in relation to adjacent fixed structures. The mobile mass element may be called a rotor and an adjacent fixed structure (or some particular region of an adjacent fixed structure) may be called a stator. The fixed anchors from which the rotor is suspended may form a part of the stator, but they may also be separate from the stator and they may have an electric potential which differs from that of the stator. The electric potential of the rotor is in some applications the same as that of the stator, but in other applications it is different.

Direct physical contact between the rotor and stator is usually not desirable because it may disturb the operation of the device. Although the rotor can be dimensioned so that direct contact does not occur in regular operation, external shocks may still displace the rotor so much that it comes into direct contact with the stator, causing structural damage, stiction, electrical short-circuits or other faults.

Motion limiters can be implemented in MEMS devices to prevent excessive physical contact between the rotor and the stator in the event of an external shock. A motion limiter may for example comprise a bump which extends from the rotor towards the stator. The gap between the motion limiter bump and the opposing region of the stator should be narrower than the other gaps between the rotor and stator in the expected direction of motion, so that the motion limiter is the first part of the rotor which comes into contact with the stator in the event of an external shock. Damage can be avoided or minimized for example by placing motion limiter bumps in regions which are distant from the most sensitive areas of the rotor and. Motion limiter bumps and corresponding structures may also be called stoppers.

However, even when motion limiter bumps are located in the less sensitive regions of the interface between the rotor and the stator, there is a risk that the impact between the bump and the rotor or stator releases particles from the opposing rotor or stator or from the bump itself. Once released, these particles can move toward the more sensitive regions of the device, limit the dynamical operation range and cause short-circuiting or other damage.

Document DE102013208684 discloses a motion limiter which comprises two flexible springs which extend partly around the rotor.

BRIEF DESCRIPTION OF THE DISCLOSURE

The object of this disclosure is achieved by an arrangement which is characterized by what is stated in the independent claim. The preferred embodiments of the disclosure are disclosed in the dependent claims.

The disclosure is based on the idea of using a motion limiter with a lever which turns around an attachment point when the rotor moves toward or away from the stator. The lever brings the motion limiter into contact with a counter-structure at an early stage of the movement. An advantage of this arrangement is that the motion limiter can act before the rotor has gained substantial momentum. In some applications, the motion limiter can also act before the rotor has moved a distance which is equal to a critical dimension.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
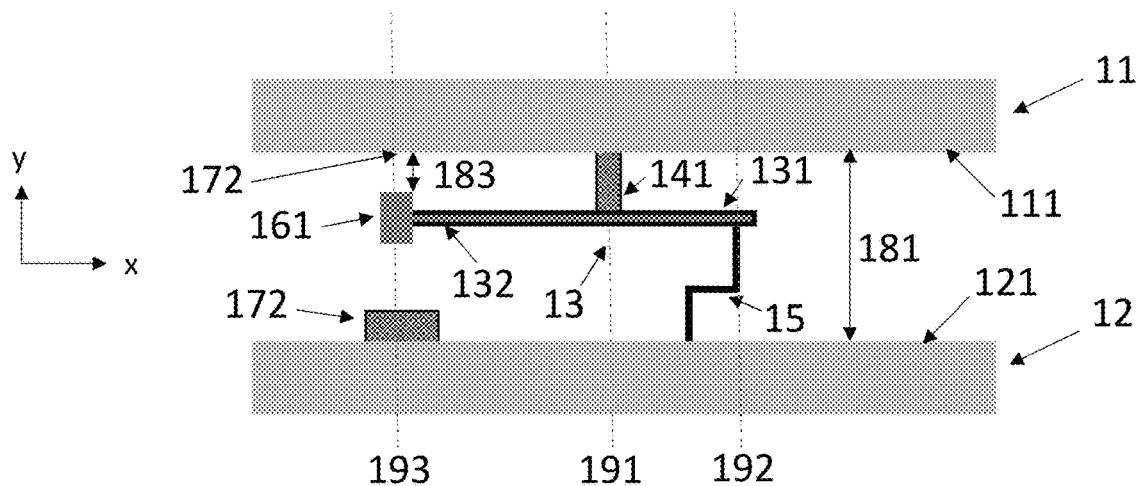
FIGS. 1a-1c illustrate a motion limiter between a first device part and a second device part.

This disclosure describes a micromechanical device comprising a first device part and a second device part which are adjacent to each other at least in a motion limiter region. One of the first and second device parts is a mobile rotor and the other of the first and second device parts is a fixed stator.

In the motion limiter region, an edge of the first device part extends substantially in a lateral direction and an edge of the second device part also extends substantially in the lateral direction. The edge of the first device part is separated from the edge of the second device part in the motion limiter region by a rotor-stator gap in a transversal direction which is orthogonal to the lateral direction.

The micromechanical device further comprises a motion limiter which extends across the rotor-stator gap from the first device part to the second device part. The motion limiter comprises a first stopper. The micromechanical device further comprises a first counter-structure. When the first or second device part which is the rotor undergoes motion in a restriction direction, the motion limiter is configured to bring the first stopper into contact with the first counter-structure before the first device part comes into direct physical contact with the second device part.

The motion limiter comprises a first attachment section which is attached to the edge of the first device part and extends toward the second device part. The first attachment section is aligned on a first transversal axis. The motion limiter further comprises a first elongated lever.

A first side of said first elongated lever extends substantially in a first side direction from the first attachment section, and a second side of said first elongated lever extends substantially in a second side direction from the first attachment section. The second side direction is opposite to the first side direction. The first stopper is attached to the second side of said first elongated lever.

The motion limiter further comprises a connecting structure which extends from the edge of the second device part to the first side of said first elongated lever. The attachment point of the connecting structure on the first side of the first elongated lever is aligned on a second transversal axis.

The motion limiter is configured to bring the first stopper into contact with the first counter-structure by rotating the first elongated lever about the first attachment point when the first or second device part which is the rotor undergoes motion in the restriction direction.

Throughout this disclosure, the first device part may be either a rotor or a stator. If the first device part is a rotor, the second device part is a stator. If the first device part is a stator, the second device part is a rotor.

The rotor may be a mass element which has been formed in a device wafer by etching. The device wafer may for example be a silicon wafer. The device wafer defines a device plane. Directions described as "lateral" are parallel to the device plane and may lie in the device plane. Directions described as "transversal" above also lie in the device plane and are perpendicular to the lateral directions. A direction which is perpendicular to the device plane may be called a vertical direction.

The motion limiter may be configured to prevent contact between the first and second device parts across the motion limiter gap. In other words, the motion limiter may be activated when the rotor moves toward the stator in the motion limiter region. However, as described in more detail below, the motion limiter may alternatively or complementarily also be configured to prevent contact between the first and second device parts somewhere else than in the motion limiter region, for example on the opposite side of the device part which is the rotor. The motion limiter may in this case be activated when the rotor moves away from the stator in the motion limiter region. As the rotor moves away from the stator in the motion limiter region, it may move closer to the stator on the transversally opposite side of the rotor.

The stoppers described in this disclosure are illustrated schematically as relatively large rectangular structures. However, a stopper can also for example be the end of an elongated lever. In general, the part of the motion limiter which first comes into contact with the counter-structure when the rotor undergoes motion in the restriction direction can be considered a stopper.

The term "restriction direction" refers to a direction in which the rotor may move either as a result of deliberate actuation or as a result of an externally imposed acceleration. The purpose of the motion limiter is to limit the movement of the rotor in the restriction direction so that the movement is stopped or reversed before it proceeds too far. In the embodiments presented in this disclosure, the restriction direction is a transversal direction in the device plane (which is illustrated as the xy-plane).

The counter-structure is the structure which the stopper strikes when the rotor has moved so far in the restriction direction that the motion limiter begins to prevent further movement. As will be explained in the embodiments below, the counter-structure may be the edge of the first or second device part, the edge of another adjacent device part or another stopper. Any edge which is used as a counter-structure may optionally comprise a protrusion which is aligned with the stopper and thereby locally shortens the distance between the edge and the stopper.

FIG. 1a illustrates a motion limiter which has been placed in a motion limiter region between a first device part 11 and a second device part 12. In all figures of this disclosure, the x-axis shows the lateral direction and the y-axis shows the transversal direction. These directions are in the device plane.

In all embodiments illustrated in this disclosure, both the first device part and the second device part are in the device plane and the motion limiter is triggered by rotor movement in the device plane.

In FIG. 1a an edge 111 of the first device part 11 extends substantially in the lateral direction and an edge 121 of the second device part 12 also extends substantially in the lateral direction. The rotor-stator gap 181 extends between the first and second device parts. The motion limiter comprises a first stopper 161.

FIG. 1a illustrates a first attachment section 141 to which a first elongated lever 13 has been attached. This first attachment section is aligned on a first transversal axis 191. The attachment should be flexible enough to facilitate rotation of the elongated lever in the illustrated plane. The first attachment section 141 may itself be sufficiently flexible to allow this rotation. Alternatively, the first attachment section may be rigid, but a separate flexure element (not illustrated) may attach the first elongated lever 13 to the first attachment section 141. The first attachment section 141 can have any suitable shape, as long as it displaces the first elongated lever 13 a sufficient distance from the edge 111 of the first device part to allow the first elongated lever 13 to undergo the amount of rotation which the motion limiter requires.

The first side 131 of the elongated lever 13 extends to the right in FIG. 1a, which is in this case the first side direction. The second side 132 of the elongated lever 13 extends to the left in FIG. 1a, which is in this case the second side direction. In other words, the first side direction may be a first lateral direction and the second side direction may be a second lateral direction, opposite to the first. However, the elongated lever 13 does not necessarily have to be parallel to the sides 111 and 121 of the first and second device parts when they are in their rest positions. It could alternatively be rotated to some extent about the first attachment section 141 even in this rest position. In that case, the first and second side directions would not be lateral directions.

The first stopper 161 is attached to the second side 132 of the elongated lever 13. In the figures of this disclosure, stoppers such as 161 have been placed at the end of the corresponding elongated lever 13. However, the stoppers could alternatively be placed closer to the first attachment section 141 than the end of the elongated lever.

FIG. 1a also illustrates schematically a connecting structure 15 which extends from the edge 121 of the second device part 12 to the first side 131 of the elongated lever 13. It can be seen in FIG. 1 that the point where the connecting structure 15 is attached to the first side 131 of the elongated lever is aligned on a second transversal axis 192. The second transversal axis 192 is separated from the first transversal axis 191 by a nonzero lateral distance.

FIG. 1a also illustrates two alternative first counter-structures 172, one of which is a protrusion on the edge 121 of the second device part 12 and the other of which is a region on the edge 111 of the first device part 11. In all embodiments of this disclosure where a counter-structure is a region on an edge of the first or second device part, the edge could optionally comprise a protrusion in the location which serves as a counter-structure. The first stopper 161 and the first counter-structure 172 are aligned on a third transversal axis 193, and they are separated from each other by a stopper gap 183. The third transversal axis 193 is separated from the first transversal axis 191 by a nonzero lateral distance.

Figure 1B:
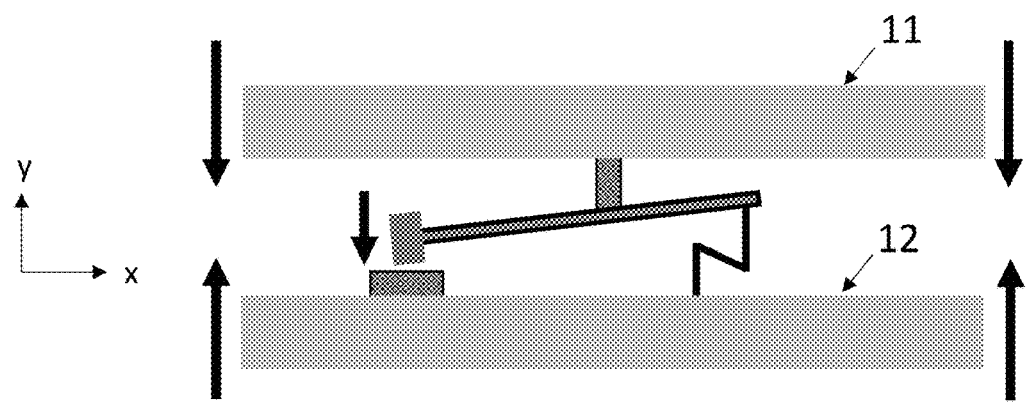
Figure 1C:
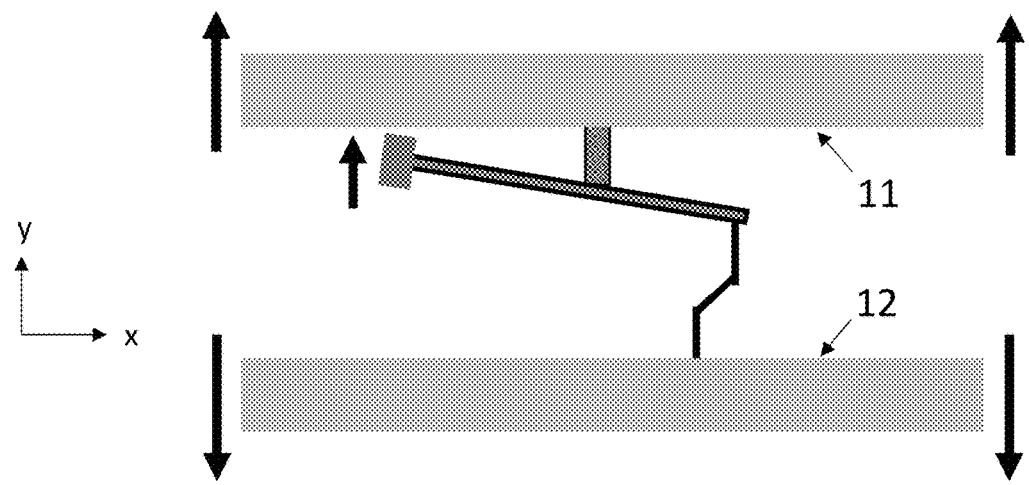

FIGS. 1b and 1c illustrate the action of the motion limiter when the rotor moves in relation to the stator. When the first or second device part which is the rotor undergoes motion in the restriction direction, the first 11 and second 12 device parts may move toward each other as FIG. 1b illustrates. Alternatively, they may move away from each other, as FIG. 1c illustrates. The arrows one the sides of the first 11 and second 12 device parts in FIGS. 1b and 1c illustrate the relative motion of these two device parts in relation to each other. In practice, only the device part which is the rotor moves, while the device part which is the stator remains substantially stationary in relation to the surrounding fixed parts of the MEMS chip.

In FIG. 1b the first and second device parts move toward each other and the connecting structure 15 pushes the first side 131 of the elongated lever 13 toward the first device part 11. The lever 13 rotates in the illustrated plane so that the first stopper 161 comes into contact with the counter-structure 172 on the edge of the second device part 12. This contact prevents the device part (11 or 12) which is the rotor from moving closer to the stator in the motion limiter region.

In FIG. 1c the first and second device parts move away from each other and the connecting structure 15 pulls the first side 131 of the elongated lever 13 away from the first device part 11. The lever 13 rotates in the illustrated plane so that the first stopper 161 comes into contact with the counter-structure 172 on the edge of the first device part 11. This contact prevents the device part (11 or 12) which is the rotor from moving further away from the stator in the motion limiter region, which may prevent the opposite edge of the rotor from moving closer to the stator outside of the motion limiter region.

If the lateral distance between transversal axes 191 and 193 is longer than the lateral distance between transversal axes 191 and 192, the impact between the stopper 161 and the counter-structure 172 will occur before the rotor-stator gap 181 has increased by a distance equal to the width of the stopper gap 183. On the other hand, if the lateral distance between transversal axes 191 and 193 is shorter than the lateral distance between transversal axes 191 and 192, the impact between the stopper 161 and the counter-structure 172 will occur after the rotor-stator gap 181 has increased by a distance equal to the width of the stopper gap 183, but the relative velocity between the stopper 161 and the counter-structure 172 will be less than the relative velocity between the rotor and the stator.

The connecting structure 15 may in any embodiment of this disclosure be a transversally flexible spring structure which is transversally compressed in the movement illustrated in FIG. 1b and transversally stretched in the movement illustrated in FIG. 1c. The benefit of this transversal flexibility is that the elongated lever 13 will remain substantially straight even when it is turned around its attachment section 141. However, it is also possible in any embodiment of this disclosure to use a transversally rigid connecting structure. This may result in some bending in the elongated lever 13, but this is not necessarily harmful. The optimal design will depend on many variables, such as the dimensions of the lever, the widths of various gaps, the mass of the rotor and the magnitude of the expected rotor displacement which the motion limiter should prevent.

Single-Lever Embodiments

FIGS. 2a-2b and 3a-3b illustrate single-lever embodiments where the motion limiter comprises only one stopper at the end of one elongated lever. In the embodiments illustrated in FIGS. 2a-2b and 3a-3b the connecting structure has been illustrated as a transversally stiff structure. However, it could alternatively be a transversally flexible structure (this option has been illustrated schematically in FIGS. 1a-1c but is not illustrated in FIGS. 2a-2b and 3a-3b).

Figure 2A:
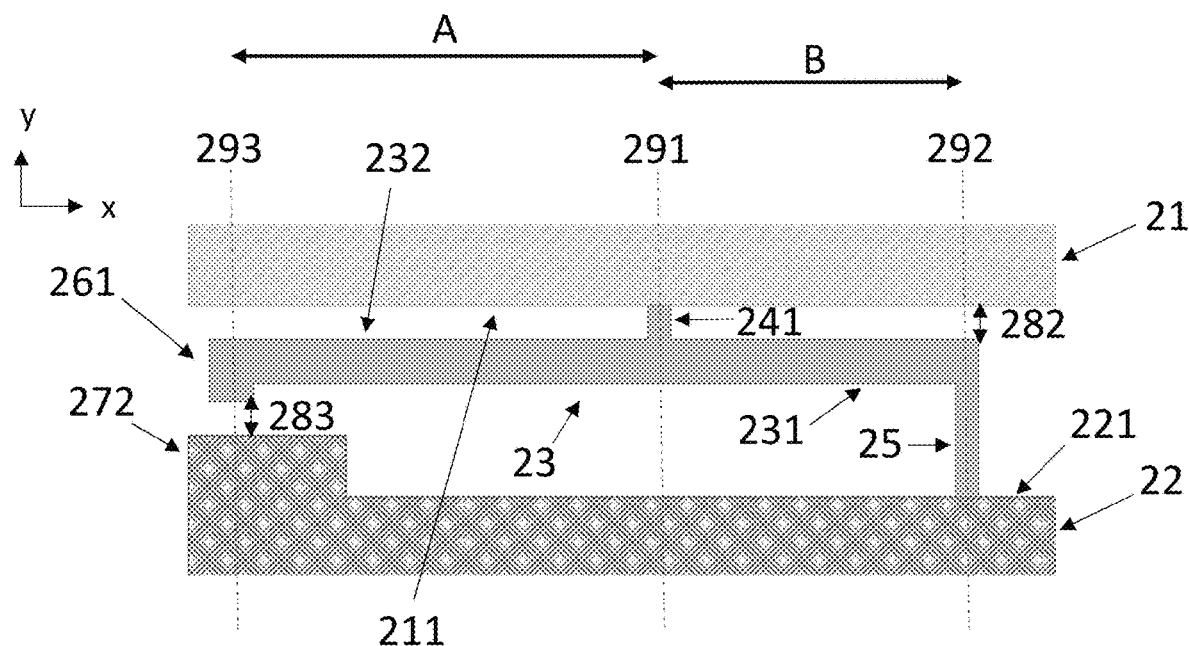
FIGS. 2a-2b and 3a-3b illustrate single-lever embodiments.
Figure 2B:
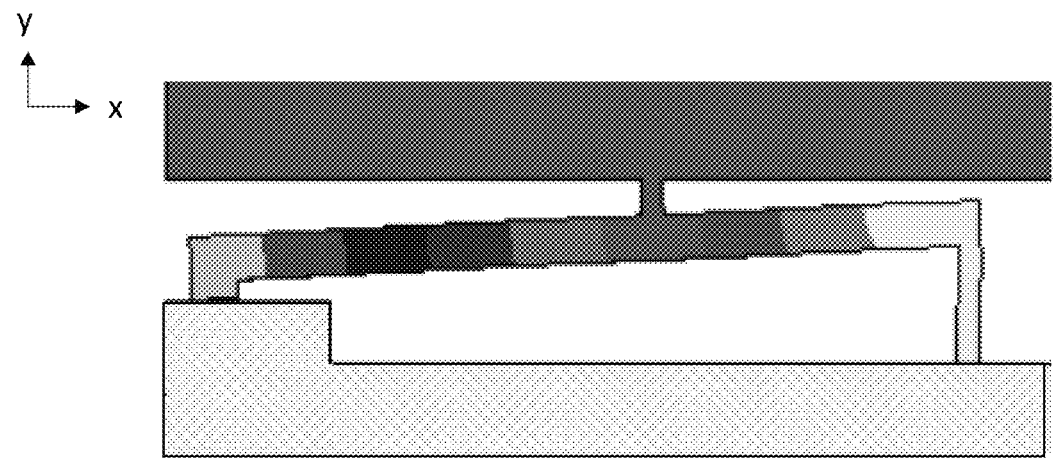

In the embodiment of FIGS. 2a-2b the first and second device parts move towards each other in the device plane when the first or second device part which is the rotor undergoes motion in the restriction direction, and the first counter-structure is a region on the edge of the second device part. The motion limiter rotates the first elongated lever in the device plane when the first or second device part which is the rotor undergoes motion in the restriction direction. The edge of the second device part may optionally comprise a protrusion which is aligned with the first stopper and a third transversal axis.

Reference numbers 21-22, 211, 221, 23, 231-232, 241, 25, 261, 272 and 291-293 correspond to reference numbers 11-12, 111, 121, 13, 131-132, 141, 15, 161, 172 and 191-193, respectively, in FIG. 1a. FIG. 2a also illustrates a gap 282 between the first end 231 of the elongated lever 23 and the edge of the first device part 211. This gap 282 may be called the lever gap. FIG. 2a also illustrates another gap 283 between the stopper 261 and the counter-structure 272. This gap 283 may be called the stopper gap.

The action of the motion limiter corresponds to the action illustrated in FIG. 1b. FIG. 2a illustrates the device parts in their rest position, and FIG. 2b illustrates the device when the first or second device part which is the rotor has moved so far towards the other device part that the motion limiter has been fully triggered and the stopper 261 comes into contact with the counter-structure 272 and begins to prevent further movement.

It is typically preferable to design the gaps and the lever dimensions so that first side 231 of the elongated lever 23 does not make contact with the edge 211 of the first device part 21 before the first stopper 261 makes contact with the counter-structure 272. Assuming that the elongated lever 23 is oriented laterally in the rest position as FIG. 2a illustrates, we can designate the lateral distance between the first 291 and third 293 transversal axes, with the letter A. We can also designate the length of the first side 231 of the elongated lever 23, which corresponds to the lateral distance between the first transversal axis 291 and the first end of the elongated lever 23, with the letter B. The length of the first side 231 of the elongated lever 23 is in the illustrated case also equal to the lateral distance between the first 291 and second 292 transversal axes because the connecting structure 25 is attached to the first end of the elongated lever 23. We can also designate the lever gap 282 with the letters LG and the stopper gap 283 with the letters SG.

It can be shown that if the elongated lever 23 rotates in the illustrated plane without bending, the first stopper 261 will make contact with the counter-structure 272 before the opposite end of the elongated lever 23 makes contact with the side 211 of the first device part 21 if the following inequality holds:

$$SG < LG \times (1 + A/B)$$

Certain practical constraints always limit the accuracy by which microelectromechanical device structures can be manufactured. There is a lower limit for how small the smallest dimensions of the device can be made while retaining sufficient reproducibility. This smallest dimension may be called the critical dimension. No key device part, and no gap between two key device parts, can typically be designed with a width smaller than the critical dimension.

A benefit which can be achieved with the present embodiment, and with all other embodiments of this disclosure, is that the action of the motion limiter is not limited by the critical dimension. The motion limiter can begin to limit the movement of rotor even before the rotor has moved a distance which is equal to the critical dimension. This benefit is achieved with the help of the lever 23.

Let's again assume that the elongated lever 23 can rotate rigidly without bending, that it is oriented laterally in its rest position, and let's define the letters A and B as above. Let's further assume that the first or second device part which is the rotor has moved toward the stator by a distance D. In other words, the rest position is shown in FIG. 2a and we assume that in FIG. 2b, where the first and second device parts have moved toward each other, the rotor-stator gap has decreased by D (compared to what it was in FIG. 2a). The first stopper 261 begins to move toward the counter-structure 272 as soon as the first and second device parts begin to move toward each other. When the rotor has moved toward the stator by a distance D, the first stopper 261 has moved downward a distance C.

The first stopper 261 will make contact with the counter-structure 272 when SG−D=C (SG still refers here to the width of the stopper gap 283 in the rest position illustrated in FIG. 2a). The first end of the lever is displaced by the distance D, and the geometry of the lever gives the relationship C=D×(A/B), which gives the result:

$$D=SG/(1+A/B)$$

This explains why the motion limiter can act even before the rotor has moved a distance which is equal to the critical dimension. If, for example, the width SG of the stopper gap 283 in the rest position is made equal to the critical dimension CD, the motion limiter will make contact when the rotor-stator gap between the first and second device parts has decreased by a distance D which is less than CD:

$$D=CD/(1+A/B)$$

The motion limiter can of course be employed even in devices where all gaps have a width which is much greater than the critical dimension. The above formula shows how early the motion limiter will be triggered.

The motion limiter will begin to act particularly early if A>B. The ratio A/B may for example be in one of the following ranges 0.5-5; 0.8-5; 1-5; 1.1-3 or 1.1-2. However, it should be noted that the functioning of the motion limiter will also depend on the magnitude of A and B and on the transversal width of the elongated lever 23. The elongated lever should have sufficient rigidity to efficiently prevent further movement of the rotor and to rotate substantially as a rigid body, so neither A nor B can be extremely large. The elongated levers described in this disclosure may for example have a lateral length/transversal width aspect ratio which is greater than 5, greater than 10 or greater than 20. The optimal dimensions will here too depend on many variables, such as the mass of the rotor, the magnitude of the expected rotor displacement which the motion limiter should prevent, and the rotational stiffness of the attachment between the elongated lever 23 and the attachment section 241.

The analysis of critical dimension given above assumed that the connecting structure 25 is transversally stiff, so that any relative movement between the first and second device parts is transferred in its full extent directly to the first end of the elongated lever 23. If the connecting structure 25 is transversally flexible, in the manner which FIG. 1b illustrates, then the displacement of the first end of the elongated lever 23 will be proportional, but not equal, to the decrease D in the rotor-stator gap. Nevertheless, the same early-impact benefits can still be obtained. The connecting structure 25 may be dimensioned so that it is sufficiently flexible to ensure that the elongated lever 23 does not bend to a significant degree, but also sufficiently stiff to transfer the momentum of the rotor to the elongated lever 23 with enough force to trigger the motion limiter in the desired manner.

Figure 3A:
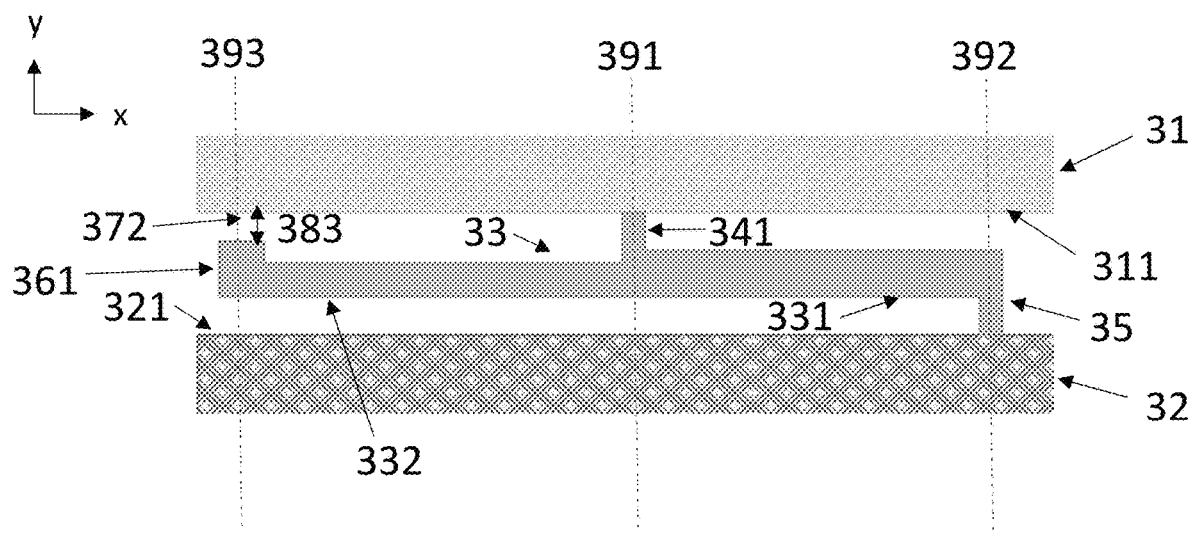
Figure 3B:
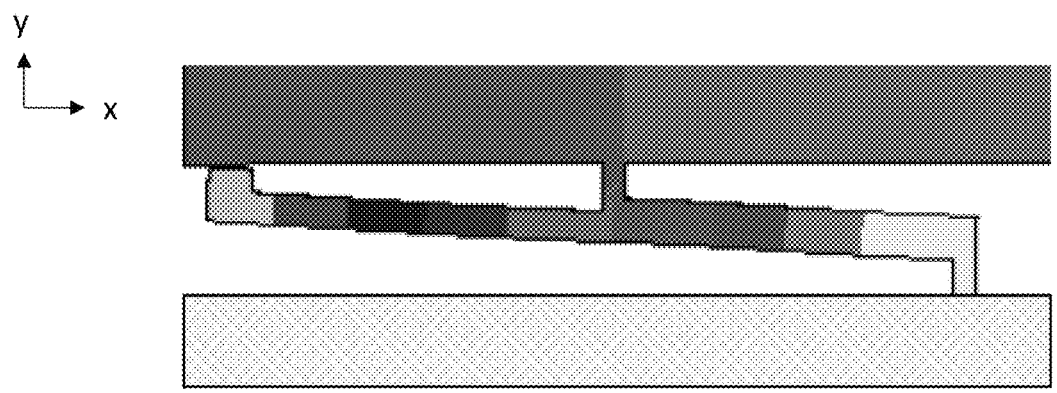

In the embodiment of FIGS. 3a-3b the first and second device parts move away from each other in the device plane when the first or second device part which is the rotor undergoes motion in the restriction direction, and the first counter-structure is a region on the edge of the first device part. The motion limiter rotates the first elongated lever in the device plane when the first or second device part which is the rotor undergoes motion in the restriction direction.

Reference numbers 31-32, 311, 321, 33, 331-332, 341, 35, 361, 372 and 391-393 correspond to reference numbers 11-12, 111, 121, 13, 131-132, 141, 15, 161, 172 and 191-193, respectively, in FIG. 1a. The action of the motion limiter corresponds to the action illustrated in FIG. 1c. FIG. 3a illustrates the device parts are in their rest positions, and FIG. 3b illustrates the device when the first or second device part which is the rotor has moved so far away from the other device part that the motion limiter has been fully triggered and the stopper 361 comes into contact with the counter-structure 372 and begins to prevent further movement.

The analysis of early impact across the stopper gap given with reference to FIGS. 2a-2b applies with one modification to FIGS. 3a-3b. Reference number 383 corresponds to reference number 283 in FIG. 2a, and the variables A, B, C and D have the same meaning as in the analysis above: C is the distance which the first stopper moves in the y-direction due to the turning of the lever, and D is the distance by which the rotor-stator gap increases. The stopper 361 again moves toward the counter structure 372, only this time it happens because the first end of the elongated lever 33 is pulled further away from the edge 311 of the first device part 31. However, the first device part 31 which contains the counter-structure 372 does not move further away from the first attachment section 341 which forms the turning point of the lever.

The first stopper 361 will therefore make contact with the counter-structure 372 when SG=C. Since C=A*D/B, contact will occur when D=SG*B/A. The stopper will therefore meet its counter-structure with an early impact (where D<SG). if A>B. If, on the other hand, B>A, then the impact will be a late impact (D>SG) but the relative velocity of the stopper 361 in relation to the counter-structure 372 will be less than the relative velocity between the first and second device parts 31 and 32.

In both FIGS. 2a-2b and 3a-3b, the connecting structure 25/35 transmits a transversal force to the first side 231/331 of the elongated lever 23/33 when the first or second device part which is the rotor 23/33 moves in the restriction direction. This force is a pushing force in FIG. 2b where the first and second device parts move towards each other, and a pulling force in FIG. 3b where the first and second device parts move away from each other. As a result of this transversal force the elongated lever rotates in the device plane and brings the first stopper 261/361 into contact with the counter-structure.

Any of the single-lever embodiments presented above can be used as a bidirectional motion limiter which is capable of limiting motion both when the first and second device parts move towards each other and when they move away from each other. This requires counter-structures on both the first and the second device parts which are sufficiently adjacent to the stopper.

Tweezer Embodiments

FIGS. 4a-4b, 5a-5b and 6a-6b illustrate double-lever embodiments where the motion limiter comprises two stoppers at the ends of two elongated levers. The action of the motion limiter resembles that of a tweezer, and these embodiments may be called tweezer embodiments.

The connecting structure may in this embodiment be a transversally flexible spring structure which comprises a second elongated lever and a second attachment section which extends from the edge of the second device part toward the first device part. The first side of said second elongated lever extends substantially in a third side direction from the second attachment section and the connecting structure further comprises a transversal connector which extends substantially along the second transversal axis from the first side of the second elongated lever to the first side of the first elongated lever.

FIG. 4 illustrates a motion limiter where reference numbers 41-42, 411, 421, 43, 431-432, 441, 461, 472 and 491-493 correspond to reference numbers 11-12, 111, 121, 13, 131-132, 141, 161, 172 and 191-193, respectively, in FIG. 1a. Reference numbers 442, 45 and 47 together correspond to reference number 15 in FIG. 1a. Reference number 45 indicates the second elongated lever and 451 indicates the first side of the second elongated lever. 442 is the second attachment section and 47 is the transversal connector.

Figure 4A:
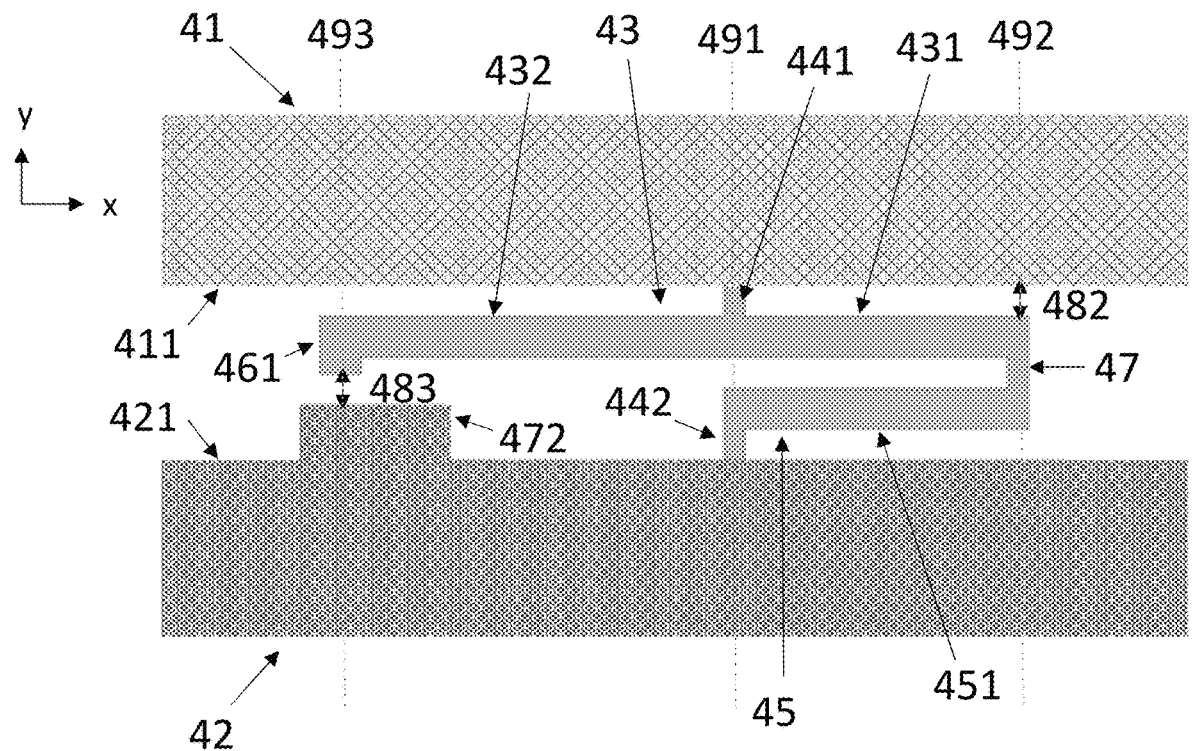
FIGS. 4a-4b, 5a-5b and 6a-6b illustrate tweezer embodiments.

The discussion given above on the direction of the first elongated lever when the rotor is in its rest position applies to the second elongated lever 45 as well. That is, the first side 451 of the second elongated lever 45 extends to the right in FIG. 4a, which is in this case the third side direction. However, the second elongated lever 45 does not necessarily have to be parallel to the sides 411 and 421 of the first and second device parts when they are in their rest positions. It could alternatively be rotated to some extent about the second attachment section 442 even in this rest position. In that case, the third side direction would not be a lateral direction. In other words, the third side direction may, but does not necessarily have to, be substantially parallel to the first side direction. The second attachment section 442 may, but does not necessarily have to be, be aligned on the first transversal axis 491 as FIG. 4a illustrates. These considerations on the second elongated lever 45 and the second attachment section 442 apply also to the other tweezer embodiments presented below.

Figure 4B:
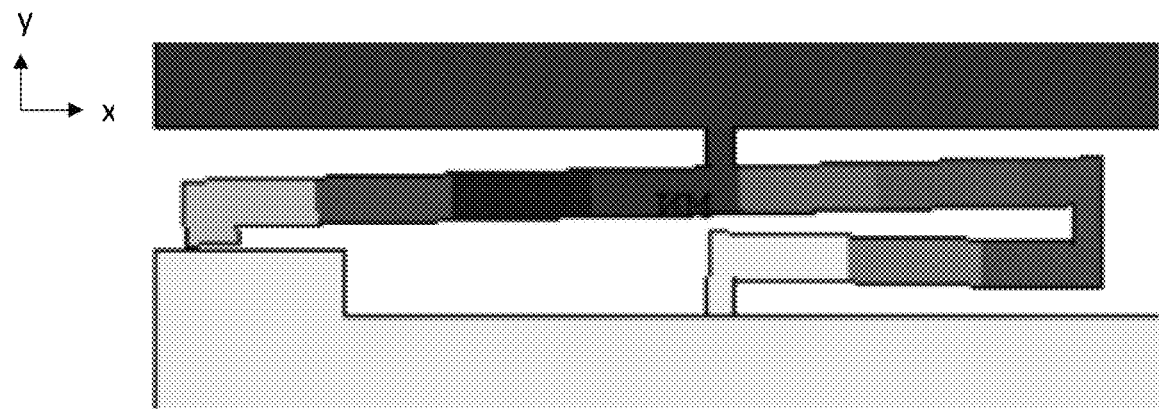

In the embodiment illustrated in FIGS. 4a-4b the first and second device parts move towards each other when the first or second device part which is the rotor undergoes motion in the restriction direction. The edge 421 of the second device part 42 is the first counter-structure. The edge 421 may optionally comprise a protrusion 472 which is aligned with the first stopper 461 on a third transversal axis 493.

The action of the motion limiter in FIG. 4a therefore corresponds to the motion limiter action illustrated in FIG. 1b and FIG. 2b. FIG. 4b illustrates the device when the first or second device part which is the rotor has moved so far toward the other device part that the motion limiter has been triggered and the stopper 461 has come into contact with the counter-structure 472 and begins to prevent further movement. The transversal flexibility of the connecting structure 442+45+47 softens the impact of the rotor on the motion limiter, but the operation principle is otherwise the same.

As above, the motion limiter may be dimensioned so that the first stopper 461 makes contact with the counter-structure 472 before the first end 431 of the first elongated lever 43 makes contact with the edge 411 of the first device part 41. This will be the case if:

$$SG < LG \times (1 + A/B),$$

where A and B are defined as in FIG. 2a and SG is the width of the stopper gap 483 in the rest position and LG is the width of lever gap 482 in the rest position.

It can also be shown that the motion limiter will make contact with the counter-structure when the rotor-stator gap between the first and second device parts has decreased by a distance D:

$$D = SG/(1 + A/B).$$

However, the relationship between D and SG will deviate to some extent from this formula due to the transversal flexibility of the connecting structure. Nevertheless, the same potential benefits relating to the critical dimension which were discussed above with reference to FIG. 2 can be achieved with this structure as well. As in the previous example, the motion limiter in FIG. 4a can be employed even when dimensions are clearly larger than the critical dimension.

FIG. 5 illustrates a motion limiter where reference numbers 51-52, 511, 521, 53, 531-532, 541, 561, 572 and 591-593 correspond to reference numbers 11-12, 111, 121, 13, 131-132, 141, 161, 172 and 191-193, respectively, in FIG. 1a. Reference numbers 542, 55 and 57 together correspond to reference number 15 in FIG. 1a, and reference number 57 corresponds to 47 in FIG. 4a.

In the tweezer embodiments illustrated in FIGS. 5a-5b and 6a-6b, the second elongated lever 55 further comprises a second side 552 which extends substantially in a fourth side direction from the second attachment section 542. The fourth side direction is opposite to the third side direction defined above. The motion limiter further comprises a second stopper 562 which is attached to the second side 552 of said second elongated lever 55. The second stopper 562 is aligned with the first stopper 561 on the third transversal axis 593. The motion limiter is configured to rotate the second elongated lever 55 in the device plane about the second attachment section 542 when the first or second device part which is the rotor undergoes motion in the restriction direction. The second attachment section 542 may be aligned on the first transversal axis 591.

Figure 5A:
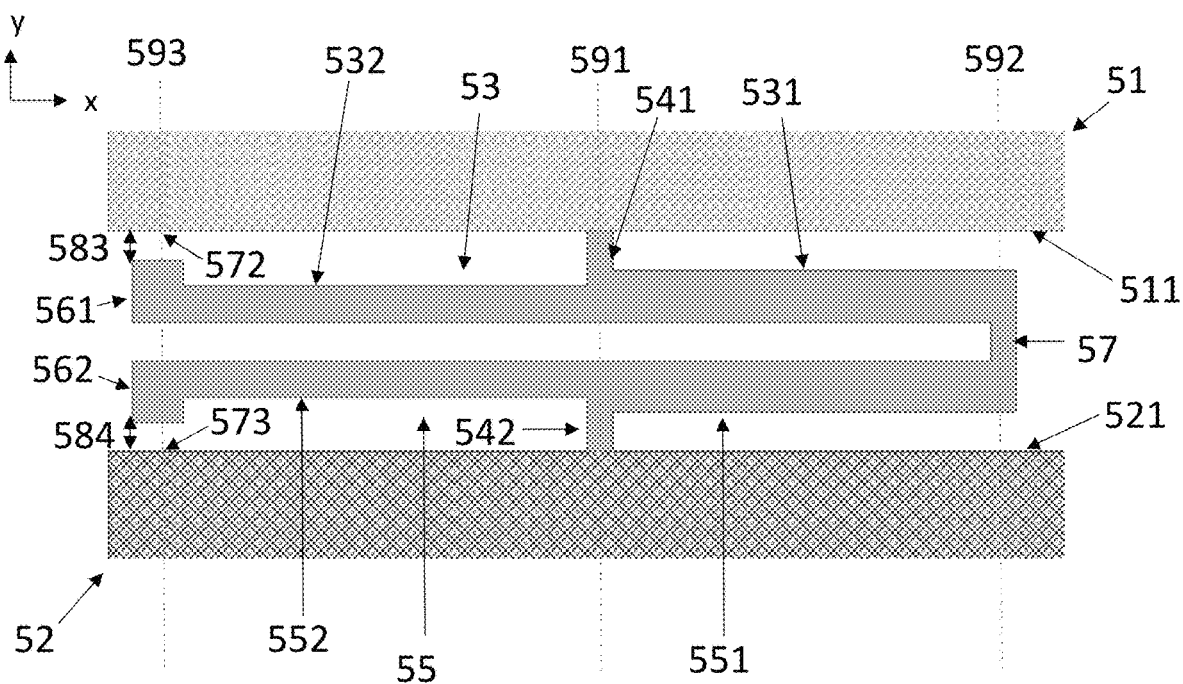
Figure 5B:

In the embodiment shown in FIGS. 5a-5b, the micromechanical device further comprises a second counter-structure 573. The motion limiter is configured to bring the second stopper 562 into contact with the second counter-structure before the first device part comes into direct physical contact with the second device part.

The first 51 and second 52 device parts move away from each other when the first 51 or second 52 device part which is the rotor undergoes motion in the restriction direction. The first counter-structure 572 is a region on the edge 511 of the first device part 51, and the second counter-structure 573 is a region on the edge 521 of the second device part 52.

The first counter-structure 572 could alternatively comprise a bump or protrusion on the edge of the edge 511 of the first device part 51. The second counter-structure 573 could alternatively comprise a bump or protrusion on the edge 512 of the second device part 52.

The action of the motion limiter in FIG. 5a corresponds to some extent to the motion limiter action illustrated in FIG. 1b. However, as FIG. 5b illustrates, this action now takes place both towards the edge of the first device part and toward the edge of the second device part. The first stopper 561 has come into contact with the first counter-structure 572, the second stopper 562 has come into contact with second counter-structure 573 and both of them begin to prevent further movement. The transversal flexibility of the connecting structure 542+55+57 again softens the impact of the rotor on the motion limiter as the two levers spread apart in different directions.

The force which is required for preventing further movement is in the illustrated arrangement distributed substantially equally between the first and second elongated levers 53 and 55. The width of the first stopper gap 583 may be equal to the width of the second stopper gap 584.

However, it is also possible to make each tweezer motion limiter asymmetric. For example, the first stopper gap 583 may be wider or narrower than the second stopper gap 584. Alternatively or complementarily, the second attachment section 542 may not be aligned on the first transversal axis 591. It may be placed either on the left or right side of the first transversal axis 591 in FIG. 5a. Further alternatives or complements to the preceding options are that the lateral length of the first elongated lever 53 may differ from the lateral length of the second elongated lever 55, and that the second stopper 562 may not be aligned on the third transversal axis 593. It may instead be placed either on the left or right side of the third transversal axis 593 in FIG. 5a. Arrangements like this can for example facilitate a two-stage motion limiter which in the first stage begins to act upon the first device part 51 (when the first stopper 561 makes contact with the first counter structure 572) and in a second stage begins to act upon the second device part 52 (when the second stopper 562 makes contact with the second counter structure 573), or vice versa.

When both stoppers 561/562 move toward the corresponding counter structure 572/573, the stoppers can make early contact with their respective counter structures due to the action of the first and second elongated levers.

Figure 6A:
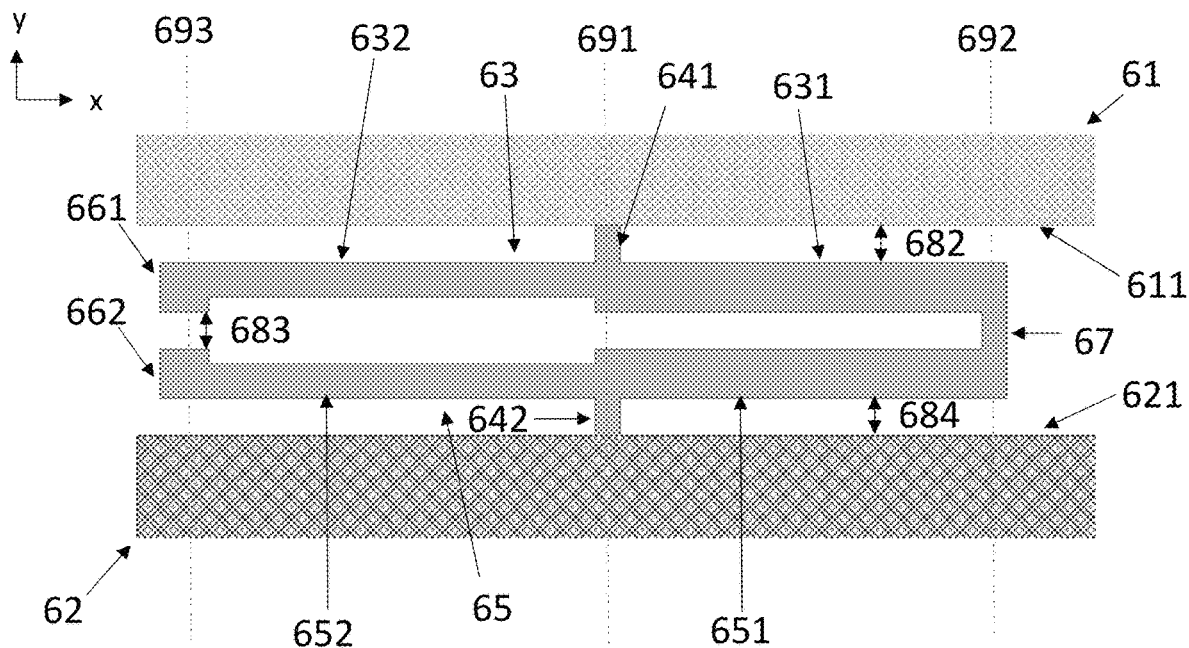
Figure 6B:
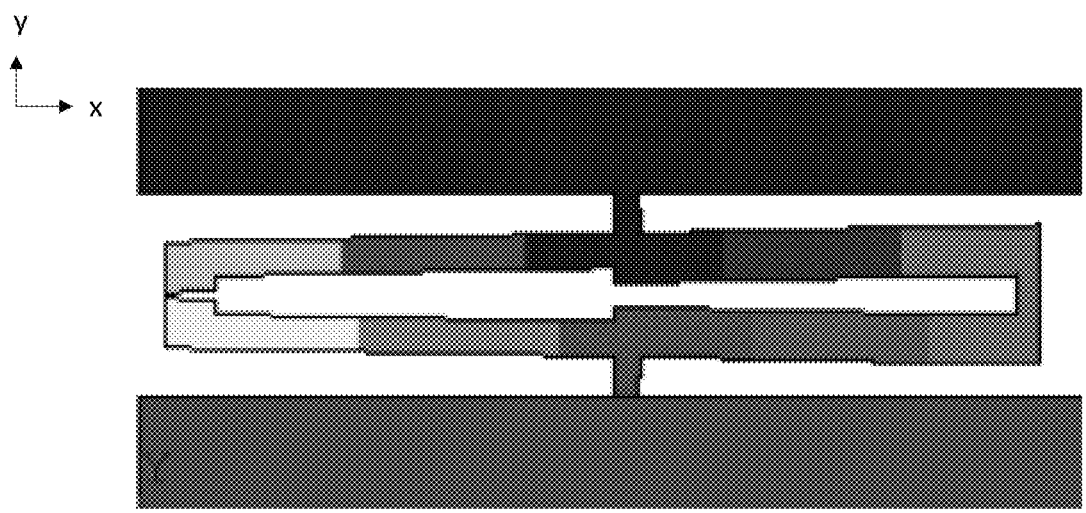

In the embodiment shown in FIGS. 6a-6b, reference numbers 61-62, 611, 621, 63, 631-632, 641, 661, and 691-693 correspond to reference numbers 11-12, 111, 121, 13, 131-132, 141, 161 and 191-193, respectively, in FIG. 1a. Reference numbers 642, 65 and 67 together correspond to reference number 15 in FIG. 1a. Furthermore, reference numbers 642, 65, 651-652 and 662 correspond to reference numbers 542, 55, 551-552 and 562, respectively, in FIG. 5a. 67 corresponds to 47 in FIG. 4a. Reference number 682 corresponds to reference number 482 in FIG. 4a, and reference number 684 indicates the corresponding lever gap for the second elongated lever.

In the motion limiter shown in FIG. 6a, the second stopper 662 is the first counter-structure, and the first 61 and second 62 device parts move towards each other when the first or second device part which is the rotor undergoes motion in the restriction direction. The stopper gap 683 is the transversal gap between the first stopper 661 and the second stopper 662.

The general principles behind early impact are the same in FIGS. 6a-6b as in FIG. 2a-2b. When the rotor has moved toward the stator by a distance D, the first stopper 661 has moved downwards a distance C and the second stopper 662 has moved upward the same distance C (assuming that the first and second elongated levers are symmetric and rotate in the same manner). But the first ends of each elongated lever are in this case not displaced by the same distance D because the connecting structure is transversally flexible. The geometry of the impact will depend on the flexibility of the connecting structure. Nevertheless, early impact across the stopper gap can be achieved with a suitable design.

In FIGS. 4a-4b, 5a-5b and 6a-6b, the transversal connector (47/57/67) transmits a transversal force between the first sides of the first and second elongated lever when the first or second device part which is the rotor moves in the restriction direction. This force pushes the first sides of the elongated levers toward the edge of the corresponding device part in FIGS. 4b and 6b, whereas it pulls the first sides of the elongated levers away from the edge of the corresponding device part in FIG. 5b. As a result of this transversal force the first and second elongated levers both rotate in the device plane and bring the stoppers into contact with their respective counter-structures.

The embodiment illustrated in FIGS. 6a-6b may easily be combined with the embodiments illustrated in FIGS. 5a-5b to form a bidirectional motion limiter which is capable of limiting motion both when the first and second device parts move towards each other and when they move away from each other. The embodiment illustrated in FIGS. 4a-4b can also be used as a bidirectional motion limiter by placing counter-structures on both the first and the second device parts.

The invention claimed is:

1. A micromechanical device comprising a first device part and a second device part which are adjacent to each other at least in a motion limiter region, and one of the first and second device parts is a mobile rotor and the other of the first and second device parts is a fixed stator, and in the motion limiter region an edge of the first device part extends substantially in a lateral direction and an edge of the second device part also extends substantially in the lateral direction, and the edge of the first device part is separated from the edge of the second device part in the motion limiter region by a rotor-stator gap in a transversal direction which is orthogonal to the lateral direction, and the micromechanical device further comprises a motion limiter which extends across the rotor-stator gap from the first device part to the second device part, and the motion limiter comprises a first stopper, and the micromechanical device further comprises a first counter-structure, and when the first or second device part which is the rotor undergoes motion in a restriction direction the motion limiter is configured to bring the first stopper into contact with the first counter-structure before the first device part comes into direct physical contact with the second device part, wherein the motion limiter comprises a first attachment section which is attached to the edge of the first device part and extends toward the second device part, wherein the first attachment section is aligned on a first transversal axis, and the motion limiter further comprises a first elongated lever, and a first side of said first elongated lever extends substantially in a first side direction from the first attachment section, and a second side of said first elongated lever extends substantially in a second side direction from the first attachment section, wherein the second side direction is opposite to the first side direction, and the first stopper is attached to the second side of said first elongated lever, and the motion limiter further comprises a connecting structure which extends from the edge of the second device part to the first side of said first elongated lever, wherein the attachment point of the connecting structure on the first side of the first elongated lever is aligned on a second transversal axis, and the motion limiter is configured to bring the first stopper into contact with the first counter-structure by rotating the first elongated lever about the first attachment point when the first or second device part which is the rotor undergoes motion in the restriction direction.

2. The micromechanical device according to claim 1, wherein the first and second device parts move away from each other in the device plane when the first or second device part which is the rotor undergoes motion in the restriction direction, the first counter-structure is a region on the edge of the first device part, and the motion limiter rotates the first elongated lever in the device plane when the first or second device part which is the rotor undergoes motion in the restriction direction.

3. The micromechanical device according to claim 1, wherein the first and second device parts move towards each other in the device plane when the first or second device part which is the rotor undergoes motion in the restriction direction, and the first counter-structure is a region on the edge of the second device part, and the motion limiter rotates the first elongated lever in the device plane when the first or second device part which is the rotor undergoes motion in the restriction direction.

4. A micromechanical device according to claim 1, wherein the connecting structure is a transversally flexible spring structure which comprises a second elongated lever and a second attachment section which extends from the edge of the second device part toward the first device part, wherein the first side of said second elongated lever extends substantially in a third side direction from the second attachment section, and the connecting structure further comprises a transversal connector which extends substantially along the second transversal axis from the first side of the second elongated lever to the first side of the first elongated lever.

5. The micromechanical device according to claim 4, wherein the first and second device parts move towards each other when the first or second device part which is the rotor undergoes motion in the restriction direction, and the edge of the second device part is the first counter-structure.

6. The micromechanical device according to claim 4, wherein the second elongated lever further comprises a second side which extends substantially in a fourth side direction from the second attachment section, wherein the fourth side direction is opposite to the third side direction, and the motion limiter further comprises a second stopper which is attached to the second side of said second elongated lever and aligned with the first stopper on a third transversal axis, and the motion limiter is configured to rotate the second elongated lever in the device plane about the second attachment point when the first or second device part which is the rotor undergoes motion in the restriction direction.

7. The micromechanical device according to claim 6, wherein the second stopper is the first counter-structure, and the first and second device parts move towards each other when the first or second device part which is the rotor undergoes motion in the restriction direction.

8. The micromechanical device according to claim 6, wherein the micromechanical device further comprises a second counter-structure, and the motion limiter is configured to bring the second stopper into contact with the second counter-structure before the first device part from comes into direct physical contact with the second device part, and the first and second device parts move away from each other when the first or second device part which is the rotor undergoes motion in the restriction direction, and the first counter-structure is a region on the edge of the first device part, and the second counter-structure is a region on the edge of the second device part.

\* \* \* \* \*